United States Patent
Choe et al.

(10) Patent No.: US 9,721,926 B2
(45) Date of Patent: Aug. 1, 2017

(54) SEMICONDUCTOR DEVICE HAVING STACKED SEMICONDUCTOR CHIPS INTERCONNECTED VIA TSV AND METHOD OF FABRICATING THE SAME

(71) Applicant: SAMSUNG ELECTRONICS CO., LTD., Suwon-si, Gyeonggi-do (KR)

(72) Inventors: Yeong-Hwan Choe, Hwaseong-si (KR); Tae-Joo Hwang, Yongin-si (KR); Tae-Hong Min, Hwaseong-si (KR); Young-Kun Jee, Cheonan-si (KR); Sang-Uk Han, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/825,403

(22) Filed: Aug. 13, 2015

(65) Prior Publication Data

US 2016/0064357 A1    Mar. 3, 2016

(30) Foreign Application Priority Data

Aug. 27, 2014 (KR) .................. 10-2014-0112319

(51) Int. Cl.
*H01L 25/065*       (2006.01)
*H01L 25/00*        (2006.01)
(Continued)

(52) U.S. Cl.
CPC ........ *H01L 25/0657* (2013.01); *H01L 23/481* (2013.01); *H01L 24/10* (2013.01);
(Continued)

(58) Field of Classification Search
CPC ........ H01L 21/486; H01L 2224/02372; H01L 2224/05025; H01L 2224/08146;
(Continued)

(56) References Cited

U.S. PATENT DOCUMENTS

| 7,989,264 B2 | 8/2011 | Park |
| 8,344,493 B2 | 1/2013 | West et al. |

(Continued)

FOREIGN PATENT DOCUMENTS

| JP | 2004-193147 A | 7/2004 |
| JP | 2004-241425 A | 8/2004 |

(Continued)

*Primary Examiner* — Selim Ahmed
(74) *Attorney, Agent, or Firm* — Lee & Morse P.C.

(57) ABSTRACT

A semiconductor device includes at least first and second semiconductor chips stacked on each other along a first direction, at least one silicon-through-via (TSV) through at least the first semiconductor chip of the first and second semiconductor chips, a contact pad on the at least one TSV of the first semiconductor chip, the contact pad electrically connecting the TSV of the first semiconductor chip to the second semiconductor chip, and a plurality of dummy pads on the first semiconductor chip, the plurality of dummy pads being spaced apart from each other and from the contact pad along a second direction, and the dummy pads having same heights as the contact pads as measured between respective top and bottom surfaces along the first direction.

27 Claims, 20 Drawing Sheets

(51) Int. Cl.
*H01L 23/48* (2006.01)
*H01L 23/00* (2006.01)

(52) U.S. Cl.
CPC .... *H01L 25/50* (2013.01); *H01L 2224/16145* (2013.01); *H01L 2224/16225* (2013.01); *H01L 2224/32225* (2013.01); *H01L 2224/73204* (2013.01); *H01L 2924/15311* (2013.01)

(58) Field of Classification Search
CPC ......... H01L 23/49822; H01L 23/49833; H01L 23/4985; H01L 23/49861
USPC ........... 257/774, E23.067, E23.174; 438/109
See application file for complete search history.

(56) References Cited

U.S. PATENT DOCUMENTS

| | | | |
|---|---|---|---|
| 2006/0207790 A1 | 9/2006 | Choi | |
| 2009/0032927 A1 | 2/2009 | Kim et al. | |
| 2011/0215457 A1 | 9/2011 | Park | |
| 2012/0098140 A1* | 4/2012 | Bartley | H01L 25/0657 257/774 |
| 2013/0181345 A1 | 7/2013 | Kanegae et al. | |
| 2013/0221493 A1* | 8/2013 | Kim | H01L 23/481 257/620 |
| 2013/0256872 A1* | 10/2013 | Su | H01L 23/3677 257/737 |
| 2013/0264720 A1 | 10/2013 | Chun et al. | |

FOREIGN PATENT DOCUMENTS

| | | |
|---|---|---|
| JP | 2013-165304 A | 8/2013 |
| KR | 10-2006-0107047 A | 10/2006 |
| KR | 10-2013-0038215 A | 4/2013 |
| KR | 10-2013-0086403 A | 8/2013 |
| KR | 10-2014-0039604 A | 4/2014 |
| WO | WO 2011/109595 A1 | 9/2011 |

* cited by examiner

SEMICONDUCTOR DEVICE HAVING STACKED SEMICONDUCTOR CHIPS INTERCONNECTED VIA TSV AND METHOD OF FABRICATING THE SAME

CROSS-REFERENCE TO RELATED APPLICATION

The present application is related to Korean Patent Application No. 10-2014-0112319, filed on Aug. 27, 2014, in the Korean Intellectual Property Office, and entitled: "Semiconductor Device and Method of Fabricating the Same," which is incorporated by reference herein in its entirety.

BACKGROUND

1. Field

Embodiments relate to a semiconductor device and a method of fabricating the same.

2. Description of the Related Art

Recently, the electronic industry, e.g., the semiconductor industry, has demanded high bandwidth and high capacity devices. Thus, a demand for techniques of stacking multi-chips has increased.

SUMMARY

Embodiments provide a semiconductor device including at least first and second semiconductor chips stacked on each other along a first direction, at least one silicon-through-via (TSV) through at least the first semiconductor chip of the first and second semiconductor chips, a contact pad on the at least one TSV of the first semiconductor chip, the contact pad electrically connecting the TSV of the first semiconductor chip to the second semiconductor chip, and a plurality of dummy pads on the first semiconductor chip, the plurality of dummy pads being spaced apart from each other and from the contact pad along a second direction, and the dummy pads having same heights as the contact pads as measured between respective top and bottom surfaces along the first direction.

The device may further include a dielectric layer on the first semiconductor chip, upper surfaces of the dielectric layer and the at least one TSV being substantially level with each other, and the plurality of dummy pads being on the dielectric layer.

The contact pad and the dummy pads may contact the dielectric layer.

The first semiconductor chip may be between a substrate and the second semiconductor chip, the dummy pads being only between the first and second semiconductor chips among the substrate and the first and second semiconductor chips.

The first semiconductor chip may be between a substrate and the second semiconductor chip, no dummy pads being on the substrate.

The plurality of dummy pads may be between the first and second semiconductor chips, the plurality of dummy pads being symmetrically arranged with respect to a center of the first semiconductor chip as viewed in top view.

The contact pad and plurality of dummy pads include a same material.

The semiconductor device may further include third and fourth semiconductor chips sequentially stacked on the second semiconductor chip, a plurality of contact pads electrically connecting each of the second, third, and fourth semiconductor chips to an underlying semiconductor chip, and the plurality of dummy pads on each of the second, third, and fourth semiconductor chips.

The semiconductor device may further include an underfill material in a space between the first and second semiconductor chips, the underfill material only partially covering lateral surfaces of each of the first and second the semiconductor chips.

Embodiments also provide a semiconductor device including at least first and second semiconductor chips stacked on each other along a first direction, the first and second semiconductor chips having same lengths along the second direction, at least one silicon-through-via (TSV) through at least the first semiconductor chip of the first and second semiconductor chips, a contact pad on the at least one TSV of the first semiconductor chip, the contact pad electrically connecting the at least one TSV of the first semiconductor chip to the second semiconductor chip, and a plurality of dummy pads between the first and second semiconductor chips, the plurality of dummy pads being symmetrically arranged on the first semiconductor chip with respect to a center of the first semiconductor chip as viewed in top view.

The contact pads and the dummy pads may include a same conductive material.

The dummy pads may be at least at corners of the first semiconductor chip.

The dummy pads may be equally spaced from each other at least along edges of the first semiconductor chip.

Embodiments also provide a semiconductor device including at least first and second semiconductor chips stacked on each other along a first direction, the first and second semiconductor chips having same lengths along the second direction, at least one silicon-through-via (TSV) through at least the first semiconductor chip of the first and second semiconductor chips, a contact pad on the at least one TSV of the first semiconductor chip, the contact pad electrically connecting the at least one TSV of the first semiconductor chip to the second semiconductor chip, and a plurality of dummy pads between the first and second semiconductor chips, each quadrant of the first semiconductor chip as viewed in top view including a same number of contact pads and a same number of dummy pads.

Top surfaces of the dummy pads and of the contact pad may be at a same distance from a bottom of the first semiconductor chip along the first direction.

The plurality of dummy pads between the first and second semiconductor chips may be symmetrically arranged on the first semiconductor chip with respect to a center of the first semiconductor chip as viewed in top view.

Embodiments also provide a method of fabricating a semiconductor device including forming at least one silicon-through-via (TSV) through a first semiconductor chip, simultaneously forming a contact pad on the at least one TSV and a plurality of dummy pads on the first semiconductor chip, and stacking a second semiconductor chip on the first semiconductor chip, such that the contact pad electrically connects the TSV of the first semiconductor chip to the second semiconductor chip.

Forming the contact pad and the plurality of dummy pads may include depositing a metal layer on an entire upper surface of the first semiconductor chip, and patterning the deposited metal layer to simultaneously form the contact pad and the plurality of dummy pads.

Embodiments also provide a method of fabricating a semiconductor device, including forming at least one silicon-through-via (TSV) through a first semiconductor chip, forming a contact pad on the at least one TSV, forming a plurality of dummy pads on the first semiconductor chip, and bonding the first semiconductor chip to an underlying structure by applying force to the plurality of dummy pads.

The method may further include stacking a second semiconductor chip on the first semiconductor chip, after bonding, such that the second semiconductor chip and the underlying structure are on opposite surfaces of the first semiconductor chip, and the contact pad electrically connects the TSV of the first semiconductor chip to the second semiconductor chip.

Patterning the deposited metal layer may include forming the plurality of dummy pads to be symmetrical on the first semiconductor chip with respect to a center of the first semiconductor chip as viewed in top view.

The underlying structure may be a semiconductor substrate.

Bonding the first semiconductor chip to the underlying structure may include contacting the plurality of dummy pads on the first semiconductor chip with a bonding tool.

Contacting the plurality of dummy pads on the first semiconductor chip with the bonding tool may include contacting only dummy pads among the dummy pads and the contact pad.

Forming the plurality of dummy pads may include forming the dummy pads symmetrically on each side of the contact pad, and contacting the plurality of dummy pads on the first semiconductor chip includes contacting all the dummy pads.

Contacting the plurality of dummy pads on the first semiconductor chip with the bonding tool may include using a bonding tool overlapping an entire top surface of first semiconductor chip, such that force is applied to the entire top surface of the first semiconductor chip.

The method may further include removing the bonding tool before stacking the second semiconductor chip on the first semiconductor chip.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
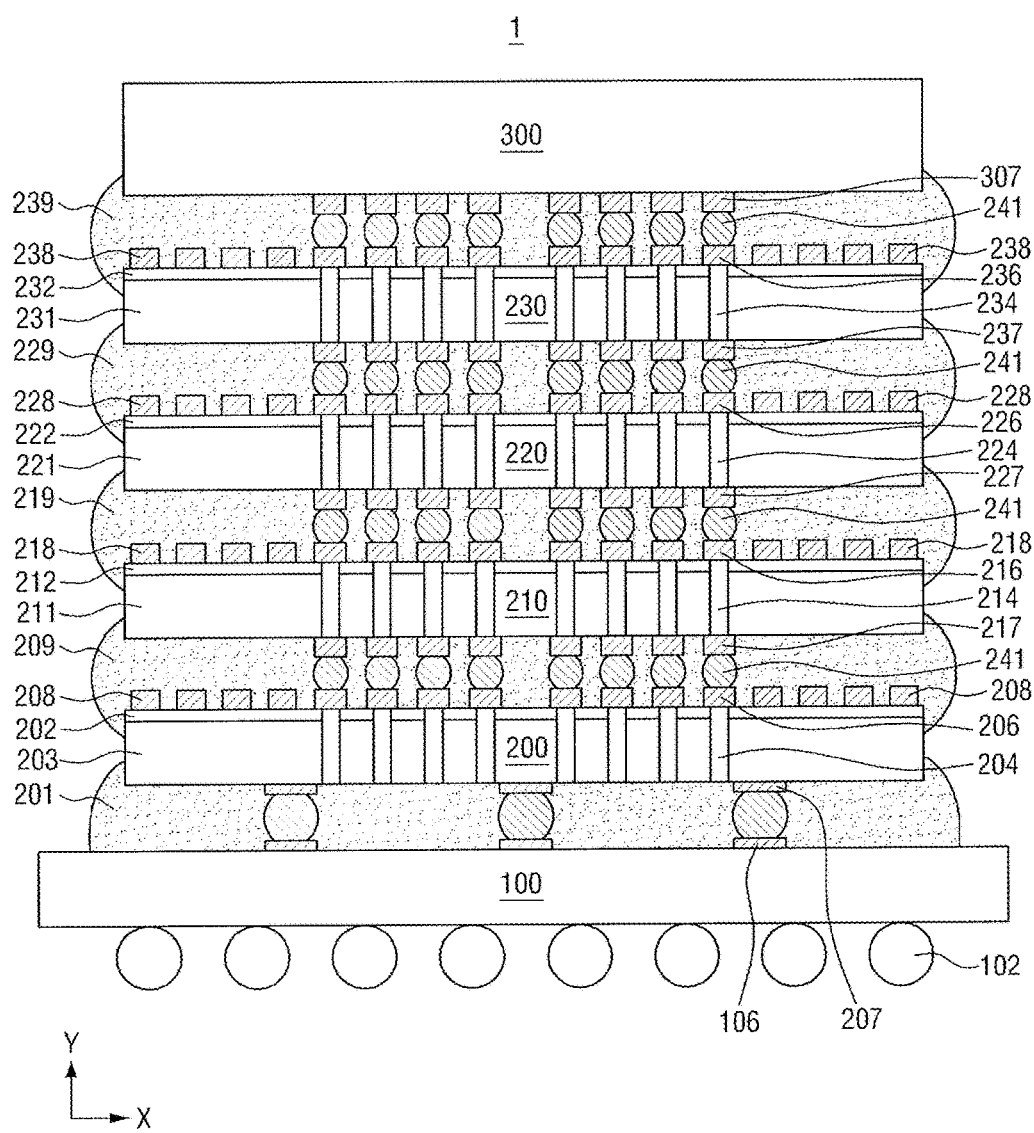
FIG. 1 illustrates a schematic cross-section of a semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when an element is referred to as being "on" another element or substrate, it can be directly on the other element or substrate, or intervening elements may also be present. Further, it will be understood that when an element is referred to as being "connected" or "coupled" to another element, it can be directly connected or coupled to another element, or one or more intervening elements may also be present. In addition, it will also be understood that when a layer is referred to as being "between" two layers, it can be the only layer between the two layers, or one or more intervening layers may also be present. Like reference numerals refer to like elements throughout.

Further, the terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 illustrates a schematic cross-sectional view of a semiconductor device according to an embodiment.

Referring to FIG. 1, a semiconductor device 1 according to an embodiment may include a substrate 100, a plurality of semiconductor chips 200, 210, 220, and 230, and an upper semiconductor chip 300.

The substrate 100 may be a silicon substrate based on a semiconductor wafer. In several embodiments, the substrate 100 may be a substrate for a package, e.g., a printed circuit board (PCB). The substrate 100 includes an upper surface and a lower surface which face each other. An external terminal 102 for electrically connecting the semiconductor chips on the substrate 100 to an external device may be formed on the lower surface of the substrate 100. Upper pads 106 may be formed on the upper surface of the substrate 100, and may be electrically connected with the external terminal 102 to supply an electric signal to the plurality of semiconductor chips 200, 210, 220, and 230, and the upper semiconductor chip 300. In several embodiments, at least one of the upper pads 106 may be a ground pad, and may be electrically connected with a ground line within the substrate 100.

The plurality of semiconductor chips 200, 210, 220, and 230 is disposed on the substrate 100. For example, the plurality of semiconductor chips 200, 210, 220, and 230 is sequentially stacked in a vertical direction, i.e., along the y-axis, to form a stack structure. In several embodiments, the plurality of semiconductor chips 200, 210, 220, and 230 may include a memory chip, a logic chip, and the like. For example, when at least one of the plurality of semiconductor chips 200, 210, 220, and 230 is a logic chip, at least one of the plurality of semiconductor chips 200, 210, 220, and 230 may be variously designed according to a performed calculation. For example, when at least one of the plurality of semiconductor chips 200, 210, 220, and 230 is a memory chip, the memory chip may be, e.g., a non-volatile memory chip. For example, the non-volatile memory chip may be a flash memory chip or a NOR flash memory chip. However, the form of the memory device according to embodiments is not limited thereto. For example, the memory chip may also include any one of a phase-change random-access memory (PRAM), a magneto-resistive random-access memory (MRAM), and a resistive random-access memory (RRAM).

A lowest semiconductor chip, i.e., the semiconductor chip 200, may be a first semiconductor chip among the plurality of semiconductor chips 200, 210, 220, and 230 to be positioned on the substrate 100, and may be electrically connected with the substrate 100 by a connection terminal 207 formed on a lower surface of the semiconductor chip 200. That is, the connection terminal 207 may electrically connect the semiconductor chip 200 and the upper pad 106 of the substrate 100. In several embodiments, a bump 241 is interposed between the connection terminal 207 and the upper pad 106 to electrically connect between the connection terminal 207 and the upper pad 106. In FIG. 1, it is illustrated that the bump 241 is a solder ball shaped like a ball, but is not limited thereto.

An underfill material 201 filling a space between the substrate 100 and the semiconductor chip 200 may be formed, e.g., deposited, between the substrate 100 and the semiconductor chip 200. For example, the underfill material 201 may surround the bumps 241 with the corresponding connection terminals 207 and upper pads 106 between the substrate 100 and the semiconductor chip 200. In several embodiments, the underfill material 201 may surround at least a part of a lateral surface of the semiconductor chip 200, e.g., the underfill material 201 may overlap a lower portion of the lateral surface of the semiconductor chip 200. The underfill material 201 may include a non-conductive material which does not conduct electricity. The underfill material 201 may be, e.g., a non-conductive film (NCF) or a die attach film (DAF), but is not limited thereto. The semiconductor chip 200 may be bonded to the substrate 100 by the underfill material 201, e.g., the bumps 241 with the corresponding connection terminals 207 and upper pads 106 may extend through the underfill material 201 between the substrate 100 and the semiconductor chip 200.

As further illustrated in FIG. 1, the semiconductor chip 200 may include an internal substrate 203, a through silicon via (TSV) 204, and a passivation layer 202. Here, the internal substrate 203 may be, e.g., a silicon substrate, similar to the substrate 100.

The TSV 204 included in the semiconductor chip 200 is formed so as to vertically, i.e., along the y-axis, pass through the internal substrate 203. In several embodiments, the TSV 204 may be formed to protrude above an upper surface of the internal substrate 203. A lateral surface of the protruding TSV 204 may be surrounded by the passivation layer 202 on the upper surface of the internal substrate 203.

In several embodiments, the TSV 204 may include at least one metal. For example, the TSV 204 may include a wiring metal layer formed at a center thereof and a barrier metal layer formed outside the wiring metal layer. In several embodiments, the wiring metal layer may include one or more of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr), and the barrier metal layer may include one or a stack structure having two or more of titanium (Ti), tantalum (Ta), titanium nitride (TiN), and tantalum nitride (TaN).

One or more contact pads 206 are formed on n upper surface of the semiconductor chip 200. The contact pads 206 formed on the upper surface of the semiconductor chip 200 may be electrically connected with an overlying structure, e.g., the semiconductor chip 210. For example, when the semiconductor chip 210 and the semiconductor chip 200 are sequentially on top of each other, the contact pads 206 may electrically connect the TSV 204 formed within the semiconductor chip 200 and the semiconductor chip 210. In several embodiments, the bump 241 is interposed between the contact pad 206 and the semiconductor chip 210 to electrically connect between the contact pad 206 and the semiconductor chip 210. In several embodiments, the bump 241 may be a micro-bump.

In several embodiments, the contact pad 206 may be formed on the upper surface of the protruding TSV 204 to overlap a part of the passivation layer 202. That is, the lower surface of the contact pad 206 may be in, e.g., direct, contact with parts of both the upper surface of the protruding TSV 204 and the upper surface of the passivation layer 202. In several embodiments, the contact pad 206 may include a metal. For example, the contact pad 206 may be a plated pad, on which plating processing is performed, and may include one or more of Au, Ni/Au, and Ni/Pd/Au.

One or more dummy pads 208 are also formed on the upper surface of the semiconductor chip 200. The dummy pad 208 may be formed on, e.g., directly on, the upper surface of the passivation layer 202. The dummy pad 208 is formed to be electrically insulated from the internal substrate 203 of the semiconductor chip 200 by the passivation layer 202, e.g., the passivation layer 202 may be in direct contact with an entire lower surface of the dummy pad 208. In various embodiments, the dummy pad 208 may be formed to have the same height as that of the contact pad 206, i.e., along the y-axis, and may be spaced apart from an overlying structure, e.g., the semiconductor chip 210. For example, the dummy pad 208 having the same height as that of the contact pad 206 may have a width or shape different from that of the contact pad 206 as a matter of course. In another example, the dummy pad 208 having the same height as that of the contact pad 206 may have the same width as that of the contact pad 206, i.e., along the x-axis. A pitch between the contact pads 206 may be the same as that between the dummy pads 208, e.g., a distance between two adjacent contact pads 206 may be the same as that between two adjacent dummy pads 208.

In several embodiments, the dummy pad 208 may include, e.g., consist essentially of, the same material as that of the contact pad 206, e.g., the dummy pad 208 may include a metal. In several embodiments, the TSV 204 may not be formed under the dummy pad 208. That is, the TSVs 204 may have a non-overlapping relationship with the dummy pads 208. For example, as illustrated in FIG. 1, a leftmost dummy pad 208 on the right side of FIG. 1 may be horizontally, i.e., along the x-axis, shifted away relative to a rightmost TSV 204 on the right side of FIG. 1.

The semiconductor chips 210, 220, and 230 disposed on the semiconductor chip 200 may be similarly formed to the aforementioned semiconductor chip 200. That is, the semiconductor chips 210, 220, and 230 may be electrically connected with the semiconductor chips 200, 210, and 220, respectively, by respective connection terminals 217, 227, and 237 formed on the corresponding lower surfaces of the semiconductor chips 210, 220, and 230. In this case, underfill materials 209, 219, and 229 may be formed between the semiconductor chips 200, 210, and 220 and the corresponding semiconductor chips 210, 220, and 230. In several embodiments, the underfill materials 209, 219, and 229 may surround, e.g., overlap, at least parts of lateral surfaces of the semiconductor chips 200, 210, 220 and at least parts of lateral surfaces of the semiconductor chips 210, 220, and 230, respectively.

The semiconductor chips 210, 220, and 230 include internal substrates 211, 221, and 231, TSVs 214, 224, and 234, and passivation layers 212, 222, and 232, respectively. Further, one or more contact pads 216, 226, and 236 are formed on upper surfaces of the semiconductor chips 210, 220, and 230, respectively. In addition, one or more dummy pads 218, 228, and 238 are also formed on the upper surfaces of the semiconductor chips 210, 220, and 230, respectively.

The various constituent elements of the semiconductor chips 210, 220, and 230 correspond to the constituent elements of the semiconductor chip 200 described previously, and the various constituent elements of the semiconductor chips 210, 220, and 230 have the same attributes as those of the corresponding constituent elements described for the semiconductor chip 200. Accordingly, descriptions of the various elements of the semiconductor chips 210, 220, and 230 overlapping those of the constituent elements described for the semiconductor chip 200 will be omitted.

Next, the upper semiconductor chip 300 is disposed on the plurality of semiconductor chips 200, 210, 220, and 230. For example, the upper semiconductor chip 300 may be additionally stacked in the stack structure including the plurality of semiconductor chips 200, 210, 230, and 230. For example, FIG. 1 illustrates that the upper semiconductor chip 300 is connected with the semiconductor chip 230 through the contact pad 238. In the various embodiments, a thickness, i.e., along the y-axis, of the upper semiconductor chip 300 may be larger than those of the semiconductor chips 200, 210, 220, and 230. In several embodiments, the upper semiconductor chip 300 may include a memory chip, a logic chip, and the like similar to the plurality of semiconductor chips 200, 210, 220, and 230.

An underfill material 239 filling a space between the semiconductor chip 230 and the upper semiconductor chip 300 may be formed between the semiconductor chip 230 and the upper semiconductor chip 300. In several embodiments, the underfill material 239 may surround, e.g., overlap, at least a part of the lateral surface of the semiconductor chip 230 and at least a part of the lateral surface of the upper semiconductor chip 300. The underfill material 239 may include a non-conductive material which does not conduct electricity. The underfill material 239 may be, e.g., an NCF or a DAF, but is not limited thereto. The upper semiconductor chip 300 may be bonded to the semiconductor chip 230 by the underfill material 229.

Figure 2:
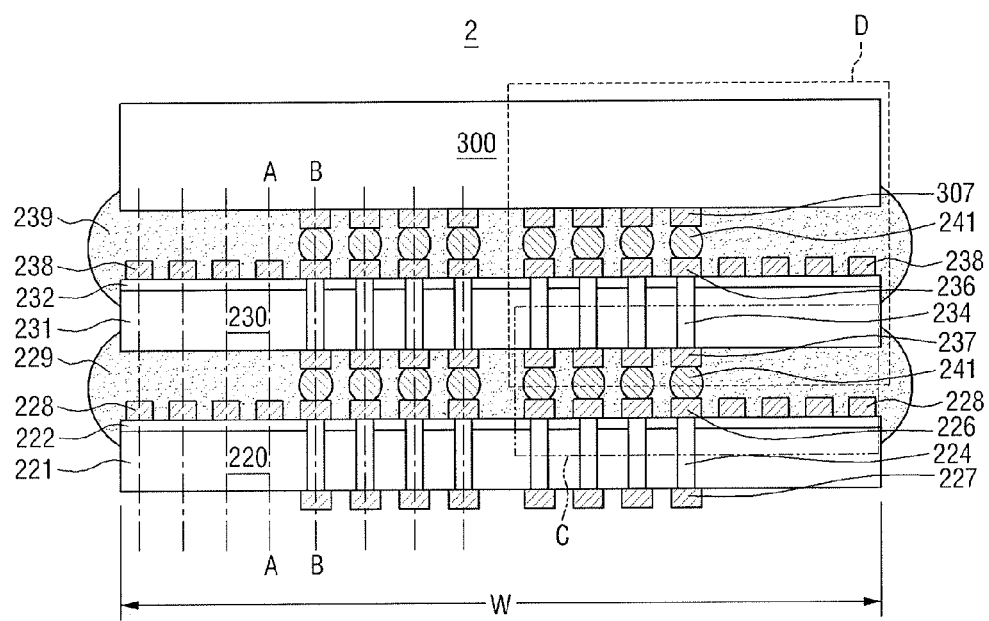
FIG. 2 illustrates a schematic cross-section of a semiconductor device according to another embodiment.

FIG. 2 is an enlarged schematic diagram of a semiconductor device according to another embodiment.

Referring to FIG. 2, a semiconductor device 2 according to the other embodiment may include a same number or a different number of stacked semiconductor chips as compared to the semiconductor device 1. For example, the semiconductor device 2 may include a first semiconductor chip 220, a second semiconductor chip 230, and the upper semiconductor chip 300.

The first semiconductor chip 220 may include one or more first TSVs 224 passing through the first semiconductor chip 220. The first TSVs 224 may be formed so as to protrude from an upper surface of the internal substrate 221 of the first semiconductor chip 220, and a lateral surface of the protruding first TSV 224 may be surrounded by the passivation layer 222 formed on the upper surface of the internal substrate 221.

The second semiconductor chip 230 is disposed on the first semiconductor chip 220. In the present embodiment, the second semiconductor chip 230 may be bonded to the first semiconductor chip 220 by a thermal pressing process, e.g., rather than by bonding via an underfill material. The second semiconductor chip 230 may include the second TSVs 234 formed in the same vertical lines as those of the first TSVs 224 of the first semiconductor chip 220. The second TSVs 234 may be formed so as to protrude from an upper surface of the internal substrate 231 of the second semiconductor chip 230, and lateral surfaces of the protruding second TSVs 234 may be surrounded by the passivation layer 232 formed on the upper surface of the internal substrate 231.

A plurality of contact pads 226 and 236 may be formed on upper surfaces of the first TSVs 224 of the first semiconductor chip 220 and the second TSVs 234 of the second semiconductor chip 230, respectively. In several embodiments, the contact pad 226 may be formed on the upper surface of the first TSV 224 and overlap a part of the passivation layer 222, and the contact pad 236 may be formed on the upper surface of the second TSV 234 and overlap a part of the passivation layer 232. As described above with reference to FIG. 1, the contact pads 226 and 236 may include a metal. In the present embodiment, the contact pads 226 and 236 may have the same height.

A plurality of dummy pads 228 and 238 having the same height as those of the plurality of contact pads 226 and 236 may be further formed on the upper surfaces of the first semiconductor chip 220 and the second semiconductor chip 230. In the present embodiment, the dummy pads 228 and 238 may include the same material as that of the contact pads 226 and 236, e.g., a metal.

The upper semiconductor chip 300 is disposed on the second semiconductor chip 230. In the present embodiment, the upper semiconductor chip 300 may be bonded to the second semiconductor chip 230 by a thermal pressing process. Further, a thickness of the upper semiconductor chip 300 may be larger than those of the first semiconductor chip 220 and the second semiconductor chip 230.

In the present embodiment, the second semiconductor chip 230 is electrically connected to the first semiconductor chip 220 through the connection terminal 237 formed on a lower surface of the second semiconductor chip 230, the bump 241, and the contact pad 226 formed on the upper surface of the first semiconductor chip 220. The upper semiconductor chip 300 is electrically connected to the second semiconductor chip 230 through the connection terminal 307 formed on the lower surface of the upper semiconductor chip 300, the bump 241, and the contact pad 236 formed on the upper surface of the second semiconductor chip 230. In this case, the contact pad 226 formed on the upper surface of the first TSV 224 of the first semiconductor chip 220 and the contact pad 236 formed on the upper surface of the second TSV 234 of the second semiconductor chip 230 may be formed on the same vertical line B-B, i.e., center lines of the contact pads 226 and 236 may be aligned. Further, a disposition pattern of the contact pad 226 formed on the first semiconductor chip 220 may be the same as that of the contact pad 236 formed on the second semiconductor chip 230.

In the present embodiment, the dummy pad 228 formed on the upper surface of the first semiconductor chip 220 and the dummy pad 238 formed on the upper surface of the second semiconductor chip 230 may be formed on the same vertical line A-A, i.e., center lines of the dummy pads 228 and 238 may be aligned along the vertical lines A-A. Further, a disposition pattern of the dummy pad 228 formed on the first semiconductor chip 220 may be the same as that of the dummy pad 238 formed on the second semiconductor chip 230.

In the present embodiment, widths W of the first semiconductor chip 220 and the second semiconductor chip 230. e.g., along the x-axis, may be the same. In addition, the first semiconductor chip 220 and the second semiconductor chip 230 may be the same kind of semiconductor chip.

The semiconductor device 2 according to the present embodiment may further include the first underfill material 229 for filling a space between the first semiconductor chip 220 and the second semiconductor chip 230, and surrounding at least a part of the lateral surface of the first semiconductor chip 220 and at least a part of the lateral surface of the second semiconductor chip 230, and the second underfill material 239 for filling a space between the second semiconductor chip 230 and the upper semiconductor chip 300, and surrounding at least a part of the lateral surface of the second semiconductor chip 230 and at least a part of the lateral surface of the upper semiconductor chip 300. As described above with reference to FIG. 1, the first underfill material 229 and the second underfill material 239 may include a non-conductive material which does not conduct electricity, e.g., a NCF.

Figure 3:
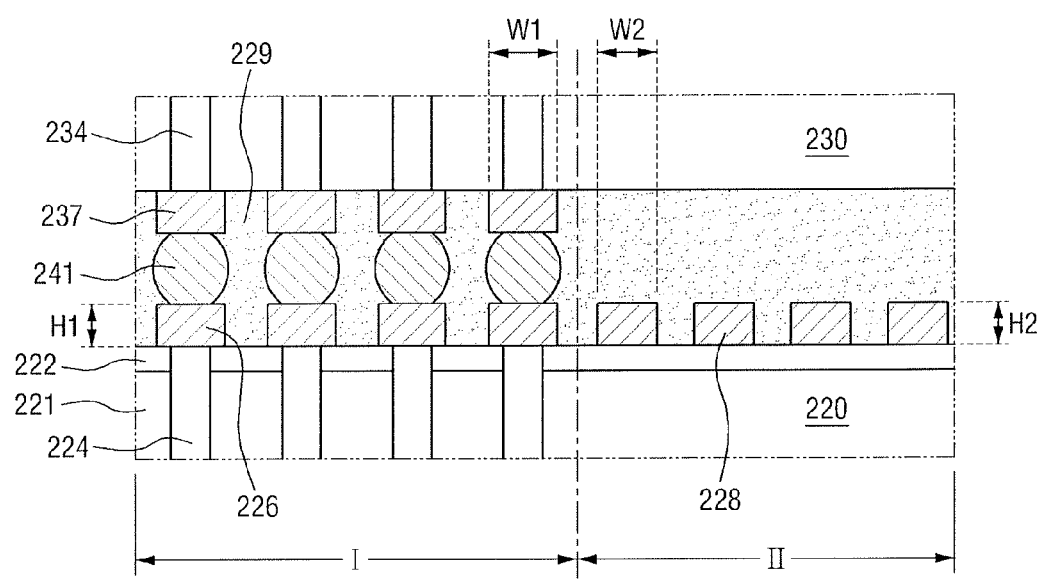
FIG. 3 illustrates an enlarged part C of FIG. 2.
Figure 4:
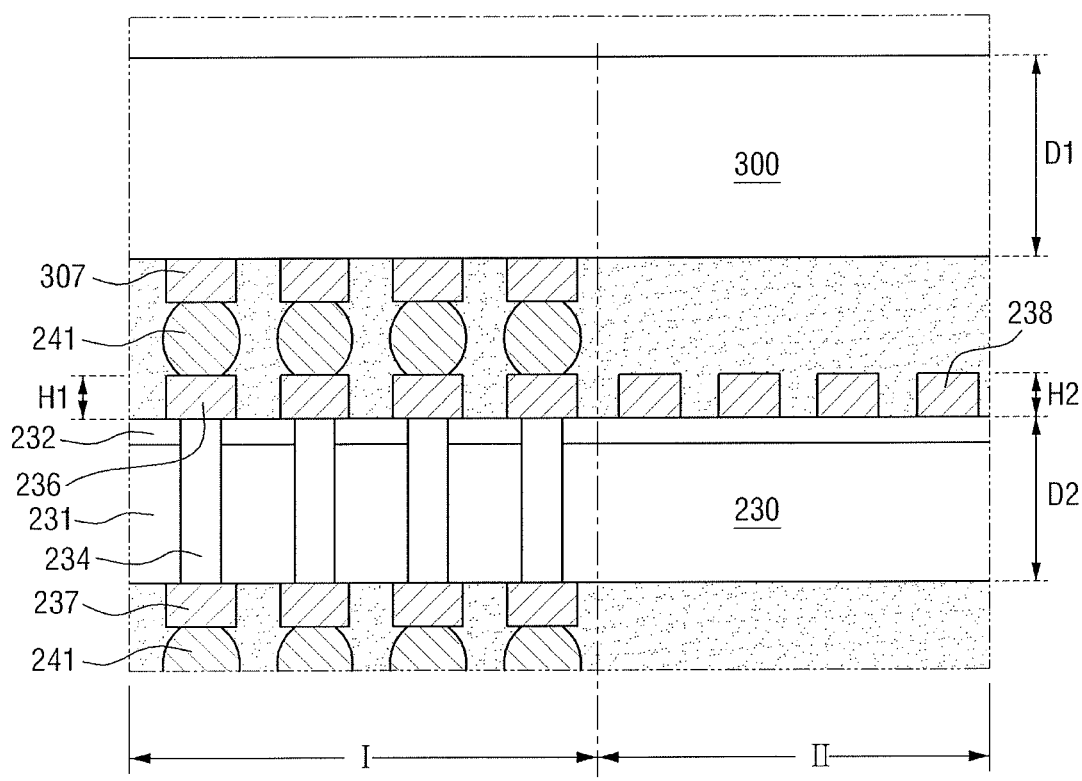
FIG. 4 illustrates an enlarged part D of FIG. 2.
Figure 5:
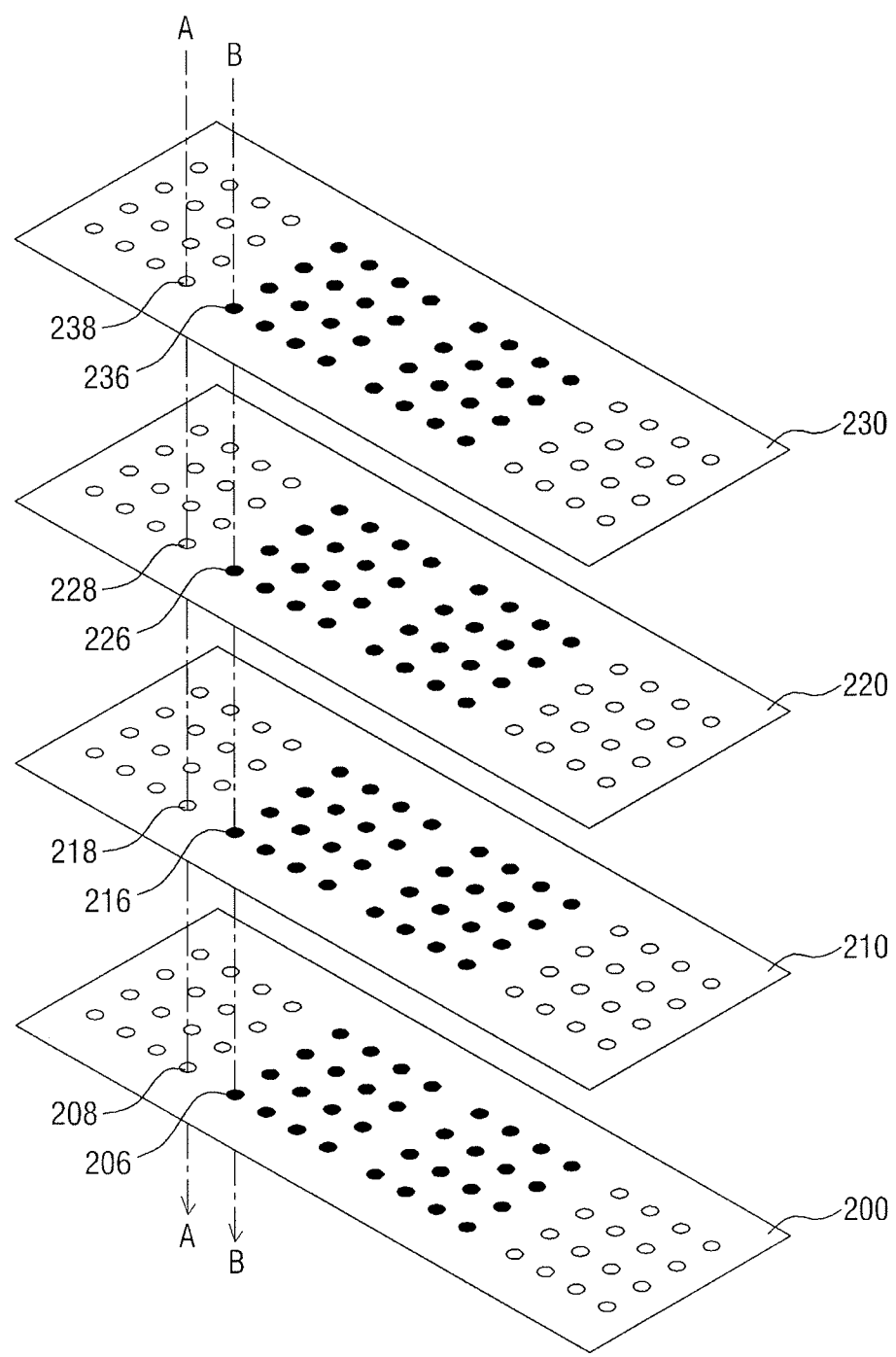
FIG. 5 illustrates an exploded diagram of a stack structure of the semiconductor device of FIG. 2.

FIG. 3 is an enlarged diagram of part C of FIG. 2, FIG. 4 is an enlarged diagram of part D of FIG. 2, and FIG. 5 is a diagram for describing a stack structure of the semiconductor device of FIG. 2.

Referring to FIG. 3, a height H2 of the dummy pad 228 formed on the upper surface of the first semiconductor chip 220 may be the same as a height H1 of the contact pad 226 formed on the upper surface of the first TSV 224 of the first semiconductor chip 220. Further, a width W2 of the dummy pad 228 formed on the upper surface of the first semiconductor chip 220 may be the same as a width W1 of the contact pad 226 formed on the upper surface of the first TSV 224 of the first semiconductor chip 220. Similarly, referring to FIG. 4, a height H2 and a width W2 of the dummy pad 238 formed on the upper surface of the second semiconductor chip 230 may be the same as a height H1 and a width W1 of the contact pad 236 formed on the upper surface of the second TSV 234 of the second semiconductor chip 230.

Referring to FIG. 5, the semiconductor device 2 of FIG. 2 may further include the semiconductor chips 200 and 210, and the contact pads 206, 216, 226, and 236, on the upper surfaces of the TSVs of the semiconductor chips 200, 210, 220, and 230, respectively, may be formed on the same respective vertical lines A and B, i.e., along the y-axis. That is, the connection units formed for the electrical connection between the plurality of semiconductor chips 200, 210, 220, and 230 are formed on the same vertical lines. Further, the dummy pads 208, 218, 228, and 238, which are formed on the upper surfaces of the semiconductor chips 200, 210, 220, and 230, respectively, may be formed on the same respective vertical lines.

FIGS. 6 to 13 illustrate diagrams for describing stages in a method of fabricating a semiconductor device according to an embodiment.

Figure 6:
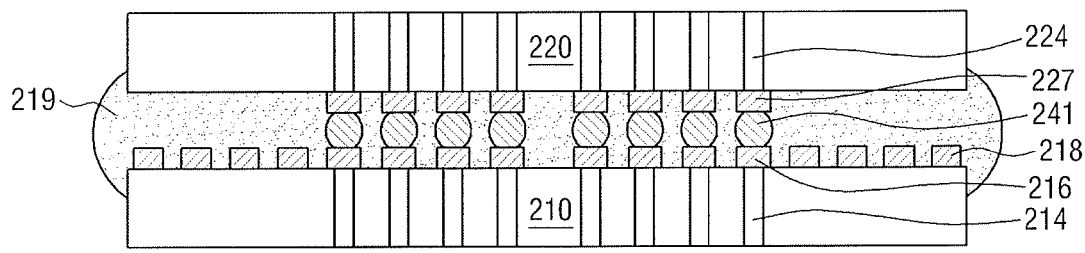
FIGS. 6 to 13 illustrate cross-sectional views of stages in a method of fabricating a semiconductor device according to an embodiment.

Referring to FIG. 6, in a method of fabricating a semiconductor device according to an embodiment, at least one TSV, e.g., a plurality of TSVs, may be formed through each semiconductor chip. The TSVs may be spaced apart from each other within each semiconductor chip, and TSVs in each semiconductor chip may be formed to be aligned with respective TSVs in another semiconductor chip. For example, as illustrated in FIG. 6, the second semiconductor chip 220 including the TSV 224 is disposed on the first semiconductor chip 210 including the TSV 214, such that the TSV 224 is aligned along the same vertical line as that of the TSV 214 of the first semiconductor chip 210. In several embodiments, the disposition of the semiconductor chip 220 on the semiconductor chip 210 may include thermal pressing, i.e., the semiconductor chip 220 against the semiconductor chip 210 in a high temperature environment, of the second semiconductor chip 220 onto the first semiconductor chip 210, as will be explained in more detail below with reference to FIG. 11.

Figure 7:
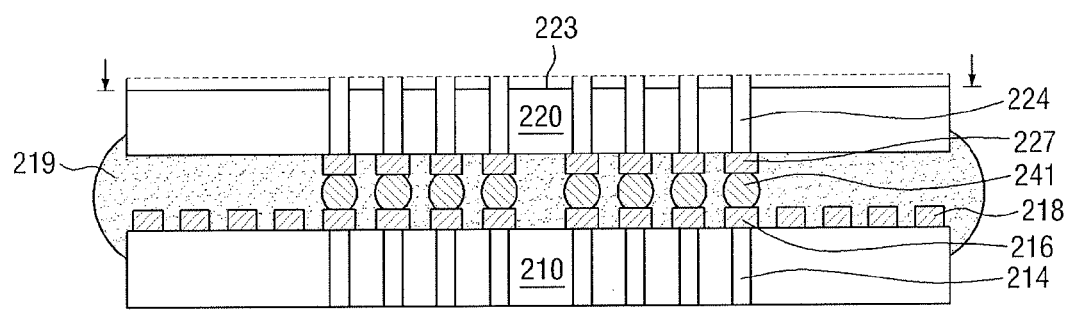

Referring to FIG. 7, the TSV 224 protrudes above the upper surface of the semiconductor chip 220, by recessing the upper surface of the semiconductor chip 220. In several embodiments, the protruding of the TSV 224 by recessing the upper surface of the semiconductor chip 220 may include recessing the upper surface of the semiconductor chip 220 by using a dry etching process.

Figure 8:
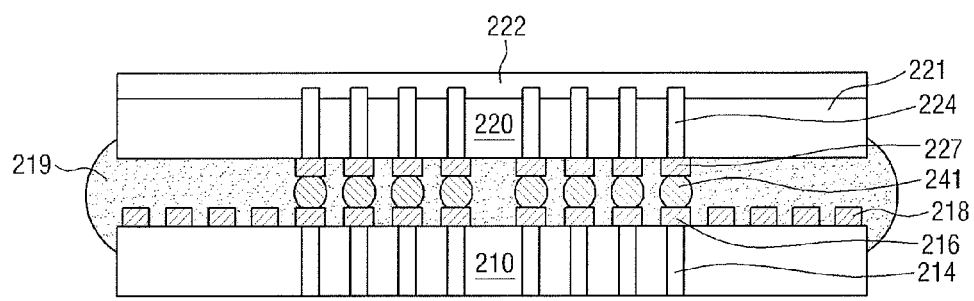

Referring to FIG. 8, the passivation layer 222 covering the protruding TSV 224 is formed on the upper surface of the semiconductor chip 220. That is, the passivation layer 222 is deposited to cover the exposed upper surface of the semiconductor chip 220 and the entire protruding TSV 224.

Figure 9:
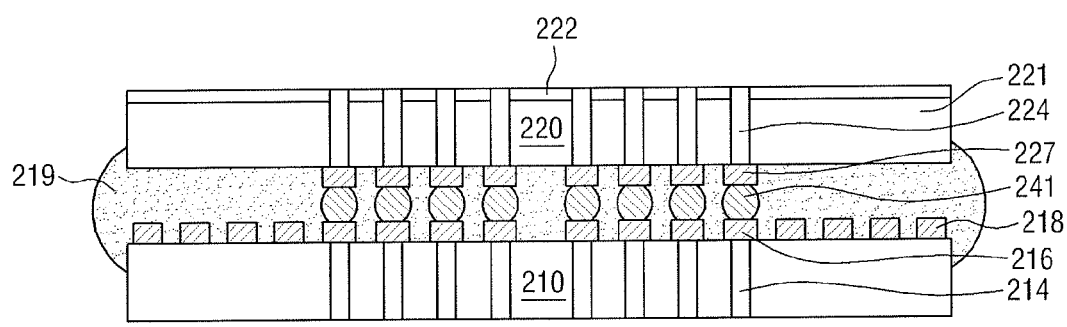

Referring to FIG. 9, an upper surface of the TSV 224 is exposed by planarizing the passivation layer 222. That is, an upper portion of the passivation layer 222 is removed until the upper surface of the TSV 224 is exposed, e.g., until the upper surface of the TSV 224 is substantially level with the upper surface of the passivation layer 222. In several embodiments, the exposing of the TSV 224 by planarizing the passivation layer 222 may include planarizing the passivation layer 222 by using a chemical mechanical polishing (CMP) process.

Figure 10:
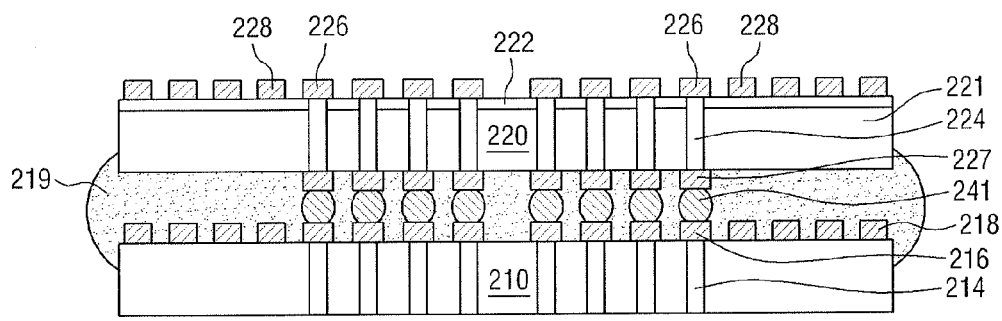

Referring to FIG. 10, the contact pad 226 is formed on the upper surface of the exposed TSV 224, i.e., a plurality of the contact pads 226 is formed on the upper surfaces of respective exposed TSVs 224, and the dummy pad 228 having the same height as that of the contact pad 226 is formed on the passivation layer 222. In several embodiments, the contact pads 226 on the upper surfaces of the exposed TSVs 224 and the dummy pads 228 have the same height. That is, the contact pads 226 and the dummy pads 228 on the passivation layer 222 may be formed simultaneously of a same layer. For example, a barrier metal layer may be formed on the upper surface of the semiconductor chip 220, followed by forming a photoresist pattern, i.e., for covering a portion in which the contact pad 226 and the dummy pad 228 are to be formed, and etching the barrier metal layer by using the photoresist pattern as a mask. In this case, shapes of the respective photoresists, which configure the photoresist pattern covering the portion, in which the contact pad 226 and the dummy pad 228 are to be formed, may be the same as each other. The simultaneous formation of the contact pads 226 and the dummy pads 228 of a metal layer on the passivation layer 222 simplifies the manufacturing process by minimizing processing steps and reducing material costs.

Figure 11:
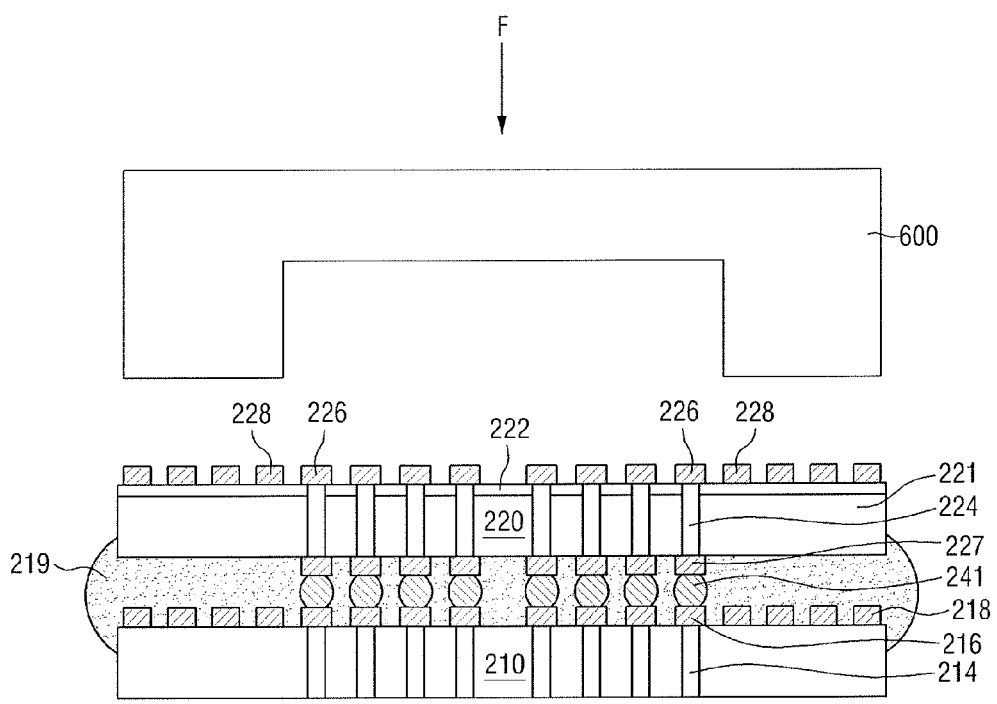

Referring to FIG. 11, a bonding tool 600 is used to bond the second semiconductor chip 220 to the first semiconductor chip 210. The bonding tool 600 contacts the plurality of dummy pads 228 on the second semiconductor chip 220 and applies a downward force F, i.e., along the y-axis, to bond the first and second semiconductor chips 210 and 220. In several embodiments, as illustrated in FIG. 11, peripheral edges 600a of the bonding tool 600 are longer than a center portion 600b of the bonding tool 600 along the y-axis, so the bonding tool 600 is arranged to have the peripheral edges 600a face the plurality of dummy pads 228 on the second semiconductor chip 220. As such, the bonding tool 600 contacts only the dummy pads 228 via the peripheral edges 600a, while the center portion 600b of the bonding tool 600 is spaced apart from the contact pads 226. Accordingly, direct force is applied only to the dummy pads 228 via contact with the peripheral edges 600a of the bonding tool 600, while the contact pads 226 remain untouched by the bonding tool 600. As such, direct force is not applied to the contact pads 226, thereby minimizing contamination of the contact pads 226 and reducing excessive force on the contact pads 226 and warping thereof.

For example, as further illustrated in FIG. 11, the dummy pads 228 may be formed symmetrically with respect to the contact pads. The bonding tool 600 may overlap the entire upper surface of the second semiconductor chip 220, while the peripheral edges 600a of the bonding tool 600 overlap all the dummy pads 228. As such, force is applied to the entire upper surface of the second semiconductor chip 220, even though the bonding tool 600 contacts directly only the dummy pads 228. The different symmetrical arrangements of the dummy pads 228 on the second semiconductor chip 220 will be discussed in more detail below with reference to FIGS. 14A-14D.

Figure 12:
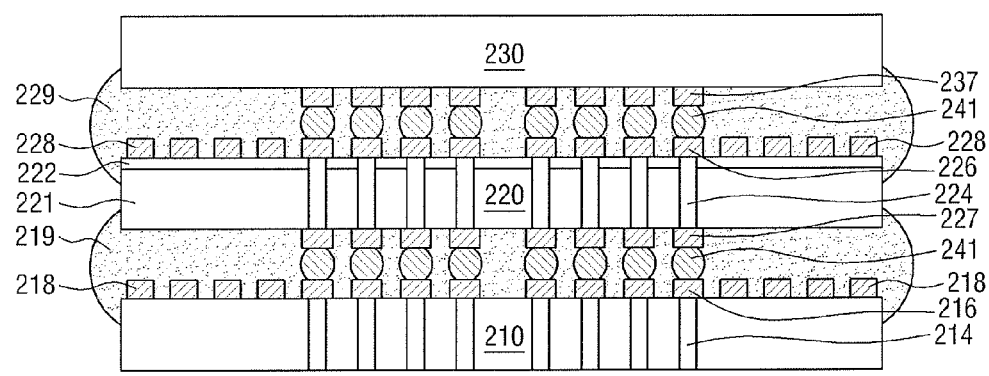

Next, referring to FIG. 12, the bonding tool 600 is removed, and the next semiconductor chip, i.e., the third semiconductor chip 230, may be stacked on the second semiconductor chip 220 via the connection terminals 237 and the bumps 241. The underfill material 229 may be deposited to fill the space between the second semiconductor chip 220 and the third semiconductor chip 230.

Figure 13:
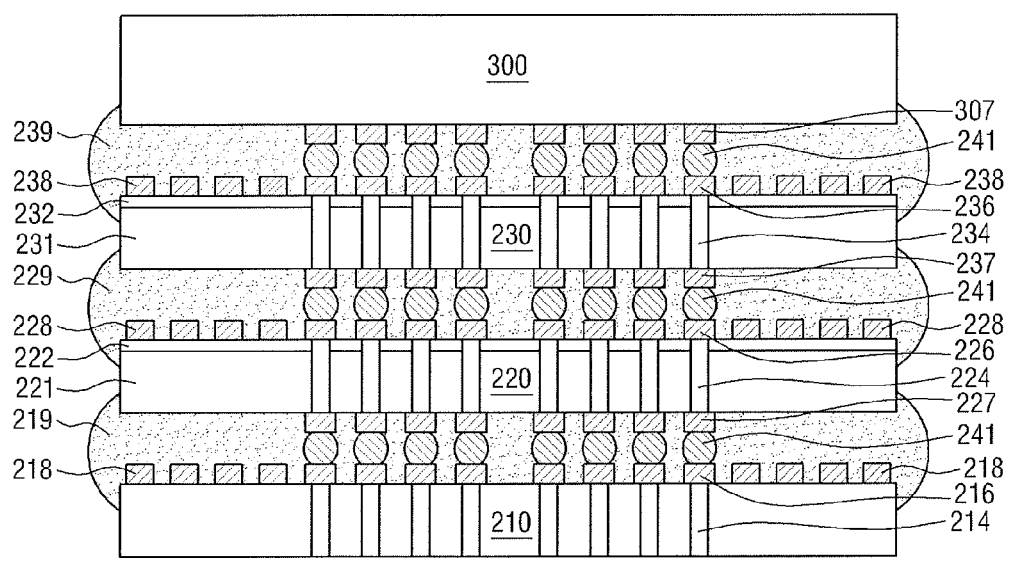

Referring to FIG. 13, the semiconductor chip 230 and the upper semiconductor chip 300 are sequentially formed on the semiconductor chip 220 by the method described with reference to FIGS. 6 to 11. Here, as discussed previously, the thickness of the upper semiconductor chip 300 may be larger than those of the semiconductor chips 220 and 230. In several embodiments, forming the third semiconductor chip 230 and the upper semiconductor chip 300 on the second semiconductor chip 220 may include thermal pressing of the third semiconductor chip 230 onto the second semiconductor chip 220 with the bonding tool 600, and then thermal pressing of the upper semiconductor chip 300 onto the third semiconductor chip 230 with the bonding tool 600.

Forming of the third semiconductor chip 230 and the upper semiconductor chip 300 on the second semiconductor chip 220 may include forming the underfill material 229 for filling the space between the second semiconductor chip 220 and the third semiconductor chip 230, and the underfill material 239 for filling the space between the third semiconductor chip 230 and the upper semiconductor chip 300. In several embodiments, the underfill material 229 may surround at least a part of the lateral surface of the second semiconductor chip 220 and at least a part of the lateral surface of the third semiconductor chip 230, and the underfill material 239 may surround at least a part of the lateral surface of the third semiconductor chip 230 and at least a part of the lateral surface of the semiconductor chip 300. In this case, the underfill materials 229 and 239 may include a NCF.

In general, when a plurality of semiconductor chips are stacked and bonded in the vertical direction, vertical force is applied to the semiconductor chips during the bonding. For example, when a semiconductor chip is bonded onto an underlying structure by using a thermal pressing process, the semiconductor chip receives a considerable amount of vertical force during the bonding. However, the vertically applied force may be distributed non-uniformly in a horizontal direction during bonding, thereby causing unstable bonding or distorting, i.e., warping, the semiconductor chip.

For example, if the force is applied vertically to a center of an upper semiconductor chip, the force may mainly be concentrated at the bumps interposed between the contact pads on an upper surface of a lower semiconductor chip and the corresponding connection terminals on a lower surface of the upper semiconductor chip. Accordingly, edges of the upper semiconductor chip may be lifted up relatively to the center thereof, thereby forming a semiconductor chip with a curved upper surface. Further, a semiconductor chip subsequently positioned on the curved upper surface of the upper semiconductor chip may be unstably bonded to the upper semiconductor chip due to the curved surface and due to a resultant non-uniform gap between the semiconductor chips. Furthermore, application of a vertical force to the center of a stack of semiconductor chips with a non-uniform gap therebetween may cause excessive protrusion, e.g., leakage, of the underfill material between the semiconductor chips. In addition, when a plurality of semiconductor chips is bonded, the resultant warped structure, e.g., a curved upper surface, of each semiconductor chip is accumulated to act as a defect of the resultant semiconductor device.

In contrast, according to the exemplary embodiments, dummy pads having the same height as that of the contact pads are formed on the upper surface of the semiconductor chip to extend to the same height as the contact pads. Further, a single bonding tool is used to overlap the entire semiconductor chip, while directly contacting only the dummy pads during bonding. As such, the considerable amount of force applied to the semiconductor chip during bonding, i.e., thermal pressing, is distributed uniformly. Therefore, the applied force may be applied simultaneously and uniformly to a larger region, i.e., the entire upper surface, of the semiconductor chip, thereby increasing the uniformity of the distributed force and minimizing the force per unit area. Accordingly, it is possible to bond the semiconductor chips by uniformly distributing force along a horizontal direction, thereby preventing or substantially minimizing warping of the semiconductor chips.

FIGS. 14A-14D illustrate different top views of dummy pad arrangements in semiconductor devices according to embodiments. Each of FIGS. 14A-14D illustrates a top view of a single semiconductor chip with dummy pads and contact pads thereon.

Referring to FIGS. 14A-14D, as discussed previously, a plurality of dummy pads may be formed between two vertically stacked semiconductor chips. The plurality of dummy pads are arranged on the lower of the two vertically stacked semiconductor chips, and each quadrant of the lower semiconductor chip, as viewed in top view, includes a same number of contact pads and a same number of dummy pads. For example, the dummy pads may be symmetrical with respect to a center O of the lower semiconductor chip as viewed in top view in each of FIGS. 14A-14D. When force is applied to the dummy pads 208, e.g., only to the dummy pads 208 among the dummy pads 208 and the contact pads 206, in the above described arrangement, sufficiently uniform force distribution may be achieved through the entire first semiconductor chip 200 to prevent edge lifting of the first semiconductor chip 200 while providing stable bonding.

Figure 14A:
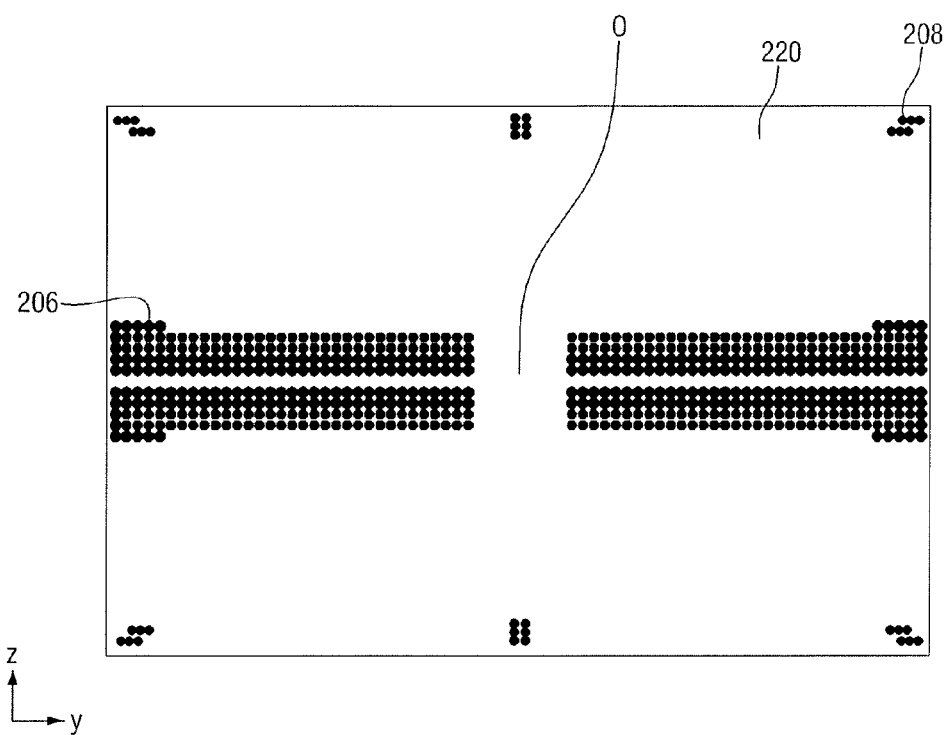
FIGS. 14A-14D illustrate different top views of dummy pad arrangements in semiconductor devices according to embodiments.

For example, as illustrated in FIG. 14A, if the first semiconductor chip 200 is divided into quadrants along the z-axis and the x-axis, each quadrant includes a same number of the contact pads 206 and a same number of the dummy pads 208. For example, a plurality of the contact pads 206 may be arranged in four groupings, each group extending along the x-axis. Further, a plurality of dummy pads 208 may be positioned in each corner of the first semiconductor chip 200, and two groupings of dummy pads 208 may be positioned to be spaced apart from each other along an imaginary line intersecting the first semiconductor chip 200 along the z-axis.

Figure 14B:
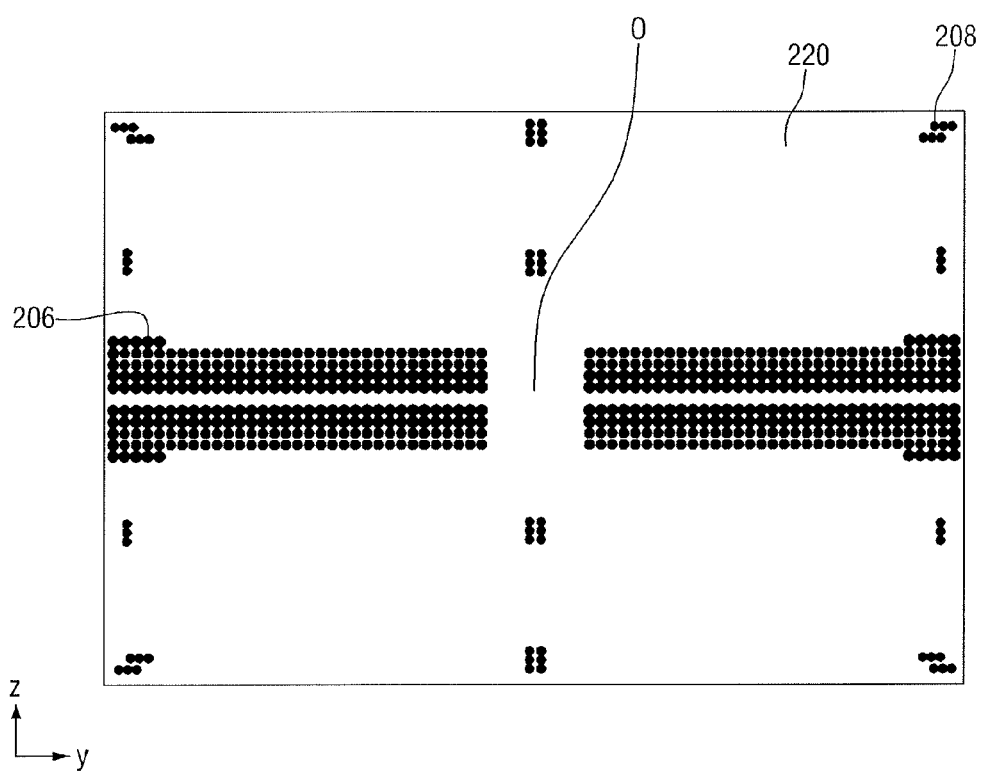

In another example, as illustrated in FIG. 14B, a plurality of dummy pads 208 may be positioned in each corner of the first semiconductor chip 200, and two groupings of dummy pads 208 may be positioned to be spaced apart from each other along an imaginary line intersecting the first semiconductor chip 200 along the z-axis, as discussed previously with reference to FIG. 14A. Further, an additional grouping of dummy pads 208 may be positioned adjacent to and spaced apart from each of the dummy pad 208 groupings in FIG. 14A. In other words, as viewed in top view, the groupings of dummy pads 208 may be arranged in a matrix pattern of 2×3 above the contact pads 206 (along the z-axis) and below the contact pads 206 (along the z-axis).

Figure 14C:
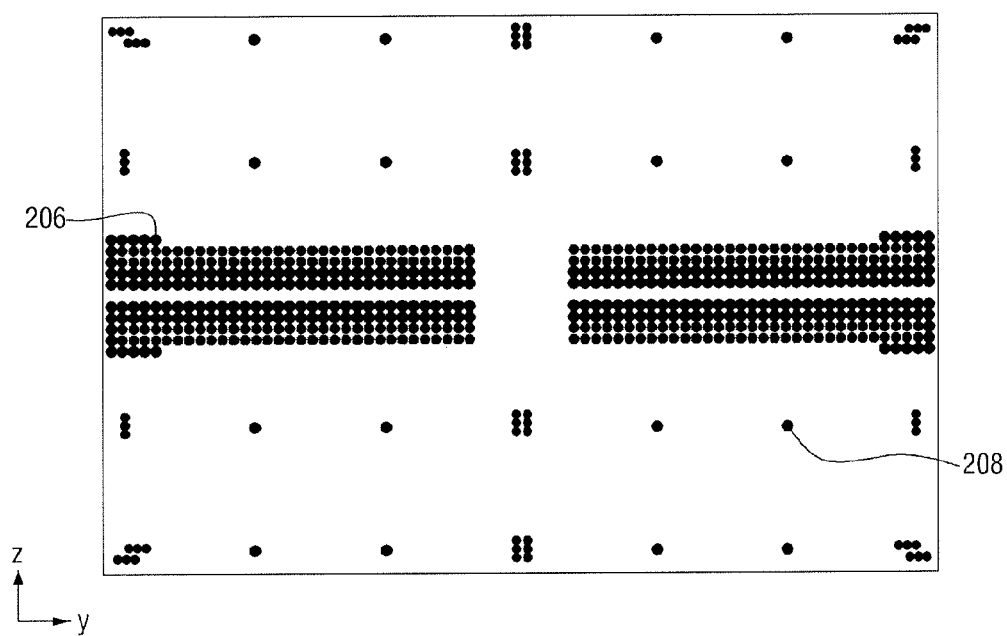

In yet another example, as illustrated in FIG. 14C, the groupings of dummy pads 208 may be arranged in a matrix pattern, e.g., of 2×7, above the contact pads 206 (along the z-axis) and below the contact pads 206 (along the z-axis). For example, the number of individual dummy pads 208 in each corner grouping may be larger than the number of individual dummy pads 208 in other positions. For example, the number of individual dummy pads 208 in positions (1,1) and (1,4) of the matrix may be larger than the number of individual dummy pads 208 in positions (2,1) and (2,4) of the matrix. Further, the number of individual dummy pads 208 in positions (2,1) and (2,4) of the matrix may be larger than the number of individual dummy pads 208 in positions (1,2) and (2,5) of the matrix.

Figure 14D:
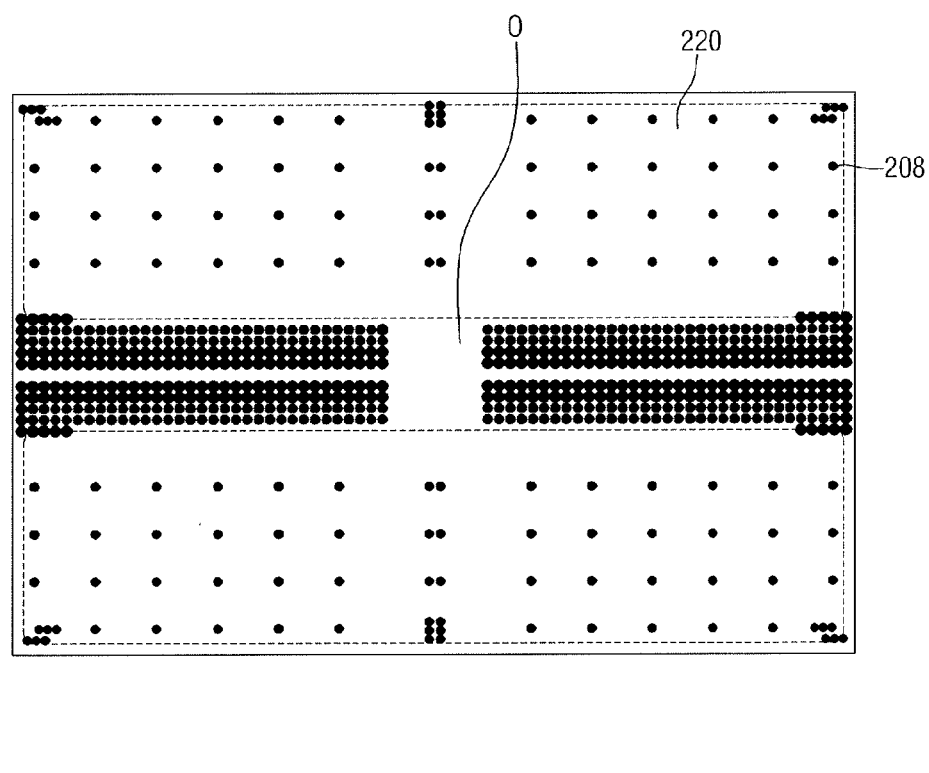

In still another example, as illustrated in FIG. 14D, the groupings of dummy pads 208 may be arranged in a matrix pattern of 13×4 above the contact pads 206 (along the z-axis) and below the contact pads 206 (along the z-axis). For example, the number of individual dummy pads 208 in each corner grouping may be larger than the number of individual dummy pads 208 in other positions.

Figure 15:
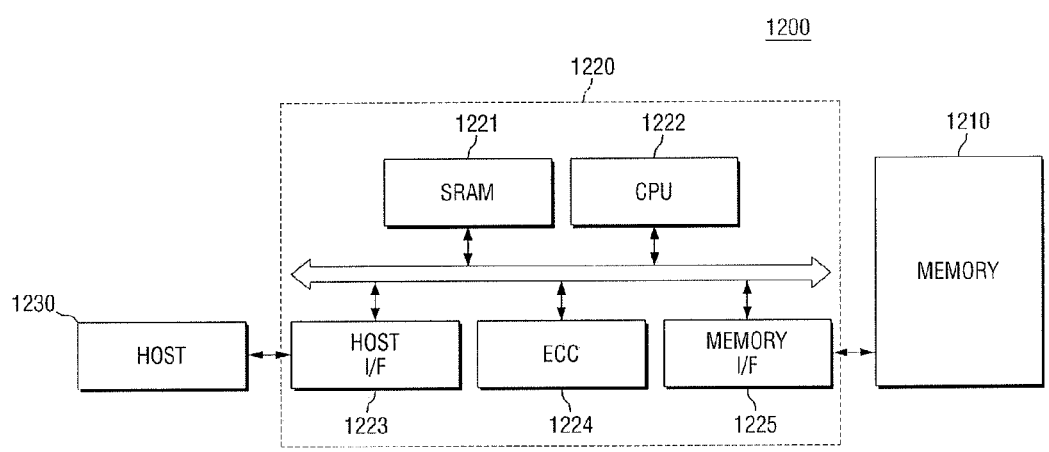
FIG. 15 illustrates a block diagram of a memory card including a semiconductor device according to embodiments.

FIG. 15 illustrates a block diagram of a memory card including a semiconductor device according to the embodiments.

Referring to FIG. 15, a memory 1210 including a semiconductor device according to embodiments may be applied to a memory card 1200. The memory card 1200 may include a memory controller 1220 for controlling data exchange between a host 1230 and the memory 1210. For example, a static random access memory (SRAM) 1221 may be used as a working memory of a central processing unit (CPU) 1222. A host interface (I/F) 1223 may include a protocol based on which the host 1230 accesses the memory card 1200 to exchange data. An error correction code (ECC) 1224 may detect and correct an error of data read from the memory 1210. A memory interface (I/F) 1225 may interface with the memory 1210. The CPU 1222 may perform a general control operation related to data exchange of the memory controller 1220.

Figure 16:
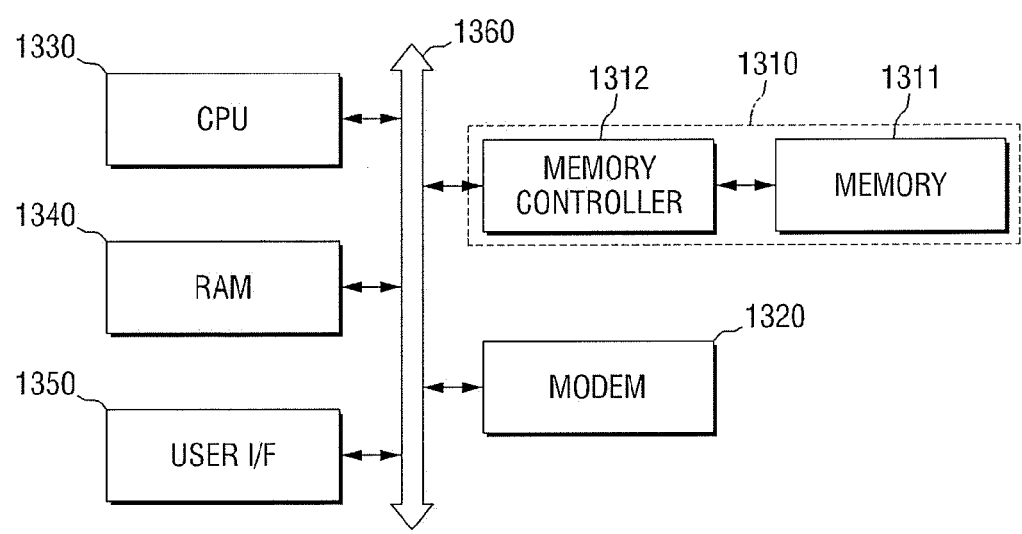
FIG. 16 illustrates a block diagram of an information processing system using a semiconductor device according to embodiments.

FIG. 16 illustrates a block diagram of an information processing system using a semiconductor device according to embodiments.

Referring to FIG. 16, an information processing system 1300 may include a memory system 1310 including a semiconductor device according to embodiments. The information processing system 1300 may include the memory system 1310, a modem 1320, a CPU 1330, a random access memory (RAM) 1340, and a user I/F 1350, which are electrically connected with a system bus 1360. The memory system 1310 may include a memory 1311 and a memory controller 1312, and may substantially have the same configuration as that of the memory card 1200 illustrated in FIG. 15. Data processed by the CPU 1330 or data received from an external device may be stored in the memory system 1310. The information processing system 1300 may be applied to a memory card, a solid-state drive (SSD) a camera image sensor, and other various chipsets. For example, the memory system 1310 may be configured to adopt the SSD, and in this case, the information processing system 1300 may stably and reliability process massive data.

Figure 17:
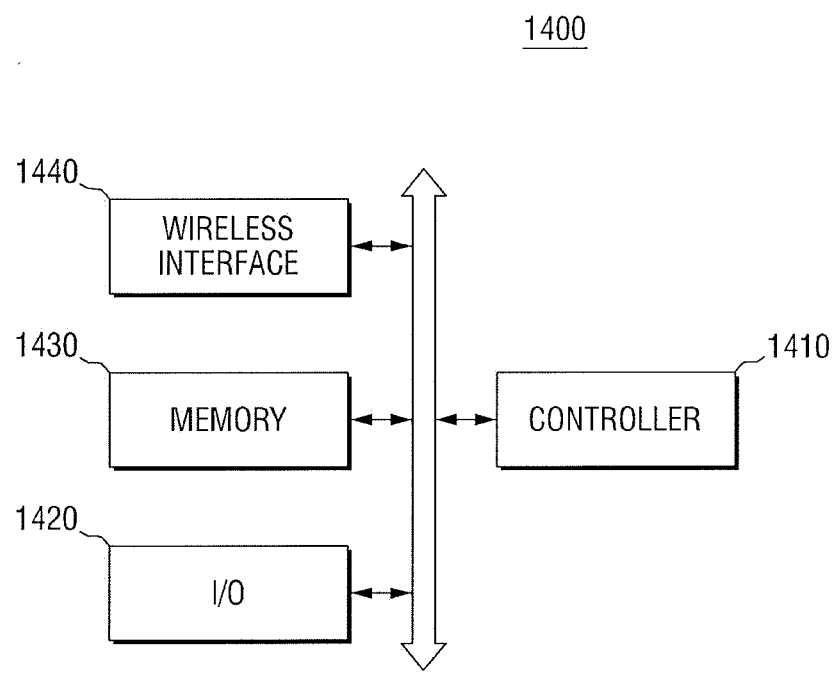
FIG. 17 illustrates a block diagram of an electronic device including a semiconductor device according to embodiments.

FIG. 17 illustrates a block diagram of an electronic device including a semiconductor device according to embodiments.

Referring to FIG. 17, an electronic device 1400 may include a semiconductor device according to embodiments. The electronic device 1400 may be used in a wireless communication device, e.g., a personal digital assistant (PDA), a notebook computer, a portable computer, a web tablet personal computer (PC), a wireless telephone, and/or a wireless digital music player, or various devices transceiving information in a wireless communication environment.

The electronic device 1400 may include a controller 1410, an input/output (I/O) device 1420, a memory 1430, and a wireless interface 1440. Here, the memory 1430 may include a semiconductor device fabricated according to embodiments. The controller 1410 may include, e.g., a microprocessor, a digital signal processor, or a processor similar thereto. The memory 1430 may be used for storing a command (or user data) processed by the controller 1410. The wireless interface 1440 may be used for transceiving data through a wireless data network. The wireless interface 1440 may include an antenna and/or a wireless transceiver. The electronic device 1400 may use, e.g., a 3rd generation communication system protocol, e.g., such as code division multiple access (CDMA), global system for mobile (GSM), north American digital communication (NADC), Extended-Time Division Multiple Access (E-TDMA), Wideband Code Division Multiple Access (WCDMA), and CDMA2000.

By way of summation and review, a core process in the technique of stacking multiple semiconductor chips is a process of bonding. However, in the process of bonding the multiple semiconductor chips, e.g., the process of bonding chips including a through silicon via (TSV), force may be concentrated at the TSV, a pad for connecting another chip, a micro bump, and the like. As such, the applied force may warp the chip and its components during the bonding process.

In contrast, according to the exemplary embodiments, dummy pads peripheral to the contact pads and having the same height as that of the contact pads are formed on the upper surface of the semiconductor chip to extend to the same height as the contact pads. When force during bonding is applied to the dummy pads via a bonding tool, uniformity of the force distribution through the entire semiconductor chip is substantially increased, thereby increasing thickness uniformity of a gap between vertically stacked semiconductor chips, as well as bonding therebetween, i.e., as lifting of edges may be prevented or substantially minimized. Further, as uniformity of applied force is increased throughout the entire semiconductor chip, peripheral leakage of underfill material may be minimized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    at least first and second semiconductor chips stacked on each other along a first direction;
    at least one silicon-through-via (TSV) through at least the first semiconductor chip of the first and second semiconductor chips;
    a contact pad on the at least one TSV of the first semiconductor chip, the contact pad electrically connecting the TSV of the first semiconductor chip to the second semiconductor chip;
    a plurality of dummy pads on an upper surface of the first semiconductor chip, the plurality of dummy pads being spaced apart from each other and from the contact pad along a second direction, and the dummy pads having same heights as the contact pads as measured between respective top and bottom surfaces along the first direction; and
    a passivation layer between the first semiconductor chip and the plurality of dummy pads, the passivation layer being in direct contact with an entire lower surface of each of the plurality of dummy pads.

2. The semiconductor device as claimed in claim 1, wherein the passivation layer extends on the first semiconductor chip between the first semiconductor chip and the contact pad, upper surfaces of the passivation layer and the at least one TSV being substantially level with each other, and the plurality of dummy pads being on the passivation layer.

3. The semiconductor device as claimed in claim 2, wherein the contact pad and the dummy pads contact the passivation layer.

4. The semiconductor device as claimed in claim 1, wherein the first semiconductor chip is between a substrate and the second semiconductor chip, the dummy pads being only between the first and second semiconductor chips among the substrate and the first and second semiconductor chips.

5. The semiconductor device as claimed in claim 1, wherein the first semiconductor chip is between a substrate and the second semiconductor chip, no dummy pads being positioned between the substrate and the first semiconductor chip.

6. The semiconductor device as claimed in claim 5, further comprising:
    third and fourth semiconductor chips sequentially stacked on the second semiconductor chip;
    a plurality of contact pads electrically connecting each of the second, third, and fourth semiconductor chips to an underlying semiconductor chip; and
    the plurality of dummy pads on each of the second, third, and fourth semiconductor chips.

7. The semiconductor device as claimed in claim 1, wherein the plurality of dummy pads is between the first and second semiconductor chips, the plurality of dummy pads being symmetrically arranged with respect to a center of the first semiconductor chip as viewed in top view.

8. The semiconductor device as claimed in claim 1, wherein the contact pad and plurality of dummy pads include a same material.

9. The semiconductor device as claimed in claim 1, further comprising an underfill material in a space between the first and second semiconductor chips, the underfill material only partially covering lateral surfaces of each of the first and second semiconductor chips.

10. A semiconductor device, comprising:
    at least first and second semiconductor chips stacked on each other along a first direction, the first and second semiconductor chips having same lengths along a second direction;
    at least one silicon-through-via (TSV) through at least the first semiconductor chip of the first and second semiconductor chips;
    a contact pad on the at least one TSV of the first semiconductor chip, the contact pad electrically connecting the at least one TSV of the first semiconductor chip to the second semiconductor chip;

a plurality of dummy pads on an upper surface of the first semiconductor chip, the plurality of dummy pads being symmetrically arranged on the first semiconductor chip with respect to a center of the first semiconductor chip as viewed in top view; and a passivation layer between the first semiconductor chip and the plurality of dummy pads, the passivation layer being in direct contact with an entire lower surface of each of the plurality of dummy pads.

11. The semiconductor device as claimed in claim 10, wherein the contact pads and the dummy pads include a same conductive material.

12. The semiconductor device as claimed in claim 10, wherein the dummy pads are at least at corners of the first semiconductor chip.

13. The semiconductor device as claimed in claim 10, wherein the dummy pads are equally spaced from each other at least along edges of the first semiconductor chip.

14. A semiconductor device, comprising:
at least first and second semiconductor chips stacked on each other along a first direction, the first and second semiconductor chips having same lengths along a second direction;
at least one silicon-through-via (TSV) through at least the first semiconductor chip of the first and second semiconductor chips;
a contact pad on the at least one TSV of the first semiconductor chip, the contact pad electrically connecting the at least one TSV of the first semiconductor chip to the second semiconductor chip; and
a plurality of dummy pads between the first and second semiconductor chips, each quadrant of the first semiconductor chip, as viewed in top view, including a same number of contact pads and a same number of dummy pads.

15. The semiconductor device as claimed in claim 14, wherein top surfaces of the dummy pads and of the contact pad are at a same distance from a bottom of the first semiconductor chip along the first direction.

16. The semiconductor device as claimed in claim 14, wherein the plurality of dummy pads between the first and second semiconductor chips is symmetrically arranged on the first semiconductor chip with respect to a center of the first semiconductor chip as viewed in top view.

17. A method of fabricating a semiconductor device, the method comprising:
forming at least one silicon-through-via (TSV) through a first semiconductor chip;
simultaneously forming a contact pad on the at least one TSV and a plurality of dummy pads on the upper surface of the first semiconductor chip;
forming a passivation layer between the first semiconductor chip and the plurality of dummy pads, such that the passivation layer is in direct contact with an entire lower surface of each of the plurality of dummy pads; and
stacking a second semiconductor chip on the first semiconductor chip, such that the contact pad electrically connects the TSV of the first semiconductor chip to the second semiconductor chip.

18. The method as claimed in claim 17, wherein forming the contact pad and the plurality of dummy pads includes:
depositing a metal layer on an entire upper surface of the first semiconductor chip; and
patterning the deposited metal layer to simultaneously form the contact pad and the plurality of dummy pads.

19. The method as claimed in claim 18, wherein patterning the deposited metal layer includes forming the plurality of dummy pads to be symmetrical on the first semiconductor chip with respect to a center of the first semiconductor chip as viewed in top view.

20. A method of fabricating a semiconductor device, the method comprising:
forming at least one silicon-through-via (TSV) through a first semiconductor chip;
forming a contact pad on the at least one TSV;
forming a plurality of dummy pads on the upper surface of the first semiconductor chip;
forming a passivation layer between the first semiconductor chip and the plurality of dummy pads, such that the passivation layer is in direct contact with an entire lower surface of each of the plurality of dummy pads; and
bonding the first semiconductor chip to an underlying structure by applying force only to the plurality of dummy pads.

21. The method as claimed in claim 20, further comprising stacking a second semiconductor chip on the first semiconductor chip, after bonding, such that the second semiconductor chip and the underlying structure are on opposite surfaces of the first semiconductor chip, and the contact pad electrically connects the TSV of the first semiconductor chip to the second semiconductor chip.

22. The method as claimed in claim 21, wherein the underlying structure is a semiconductor substrate.

23. The method as claimed in claim 21, wherein bonding the first semiconductor chip to the underlying structure includes contacting the plurality of dummy pads on the first semiconductor chip with a bonding tool.

24. The method as claimed in claim 23, wherein contacting the plurality of dummy pads on the first semiconductor chip with the bonding tool includes contacting only dummy pads among the dummy pads and the contact pad.

25. The method as claimed in claim 24, wherein forming the plurality of dummy pads includes forming the dummy pads symmetrically on each side of the contact pad, and contacting the plurality of dummy pads on the first semiconductor chip includes contacting all the dummy pads.

26. The method as claimed in claim 23, wherein contacting the plurality of dummy pads on the first semiconductor chip with the bonding tool includes using a bonding tool overlapping an entire top surface of first semiconductor chip, such that force is applied to the entire top surface of the first semiconductor chip.

27. The method as claimed in claim 23, further comprising removing the bonding tool before stacking the second semiconductor chip on the first semiconductor chip.

* * * * *

UNITED STATES PATENT AND TRADEMARK OFFICE
CERTIFICATE OF CORRECTION

PATENT NO. : 9,721,926 B2  
APPLICATION NO. : 14/825403  
DATED : August 1, 2017  
INVENTOR(S) : Yeong-Hwan Choe et al.

Page 1 of 1

It is certified that error appears in the above-identified patent and that said Letters Patent is hereby corrected as shown below:

On the Title Page

In the Abstract:

(57) Replace "silicon-through-via (TSV)" with "through-silicon-via (TSV)"

In the Specification

Column 1 Lines 30-31 - Replace "silicon-through-via (TSV)" with "through-silicon-via (TSV)"

Column 2 Line 12 - Replace "silicon-through-via (TSV)" with "through-silicon-via (TSV)"

Column 2 Line 33 - Replace "silicon-through-via (TSV)" with "through-silicon-via (TSV)"

Column 2 Lines 51-52 - Replace "silicon-through-via (TSV)" with "through-silicon-via (TSV)"

Column 2 Lines 65-66 - Replace "silicon-through-via (TSV)" with "through-silicon-via (TSV)"

In the Claims

Claim 1 - Replace "silicon-through-via (TSV)" with "through-silicon-via (TSV)"

Claim 10 - Replace "silicon-through-via (TSV)" with "through-silicon-via (TSV)"

Claim 14 - Replace "silicon-through-via (TSV)" with "through-silicon-via (TSV)"

Claim 17 - Replace "silicon-through-via (TSV)" with "through-silicon-via (TSV)"

Signed and Sealed this  
Twenty-fourth Day of October, 2017

Joseph Matal  
*Performing the Functions and Duties of the*  
*Under Secretary of Commerce for Intellectual Property and*  
*Director of the United States Patent and Trademark Office*